United States Patent [19]

Nadd

[11] Patent Number: 5,563,759
[45] Date of Patent: Oct. 8, 1996

[54] PROTECTED THREE-PIN MOSGATED POWER SWITCH WITH SEPARATE INPUT RESET SIGNAL LEVEL

[75] Inventor: Bruno C. Nadd, Puyvert, France

[73] Assignee: International Rectifier Corporation, El Segundo, Calif.

[21] Appl. No.: 420,193

[22] Filed: Apr. 11, 1995

[51] Int. Cl.$^6$ .................................................. H02H 3/02
[52] U.S. Cl. ........................... 361/101; 361/103; 323/277
[58] Field of Search .............................. 361/98, 100–101, 361/103, 18; 327/403–405, 408, 415–417; 323/274–277, 282–285

[56] References Cited

U.S. PATENT DOCUMENTS

| | | | |
|---|---|---|---|
| 4,703,390 | 10/1987 | Fay et al. .............................. | 361/101 |
| 5,497,285 | 3/1996 | Nadd ...................................... | 361/103 |

Primary Examiner—Jeffrey A. Gaffin
Assistant Examiner—Michael J. Sherry
Attorney, Agent, or Firm—Ostrolenk, Faber, Gerb & Soffen, LLP

[57] ABSTRACT

A three-terminal Smart Power MOSgated device has short circuit, over-temperature and over-voltage protection and the like. The control circuit and the protective circuits are powered from an input or control pin connected to a microprocessor. The output of the microprocessor is connected to a resistive divider circuit such that three potentials can be selectively produced at the divider mode, and comprise an on-level signal, an off-level signal and a reset level signal respectively. The control circuit contains an R-S latch which turns on in the absence of a fault signal to connect the on and off signal levels to the MOSgated device. During a fault, the R-S latch disconnects the control circuit input from the MOSgated device, and is reset only by the reset level signal which is distinct from the off signal level which is incapable of resetting the R-S latch.

12 Claims, 3 Drawing Sheets

PROTECTED THREE-PIN MOSGATED POWER SWITCH WITH SEPARATE INPUT RESET SIGNAL LEVEL

RELATED APPLICATIONS

This application is related to copending application Ser. No. 08/298,383 (IR-1070), filed Aug. 30, 1994, entitled POWER MOSFET WITH OVERCURRENT AND OVER-TEMPERATURE PROTECTION AND CONTROL CIRCUIT DECOUPLED FROM BODY DIODE in the names of Bruno C. Nadd and Talbott M. Houk, which is assigned to the assignee of the present invention.

BACKGROUND OF THE INVENTION

This invention relates to Smart Power MOSgated devices, and more particularly relates to a Smart Power circuit in which a unique reset signal for resetting the fault latch circuit after a fault is applied to the circuit input pin and in which the device off-signal input level cannot reset the fault latch of the circuit.

Smart Power devices are well known power switching devices in which a MOSgated device, typically a power MOSFET, is provided with "intelligence" such as circuits which monitor the device temperature, current and voltage conditions and turn the device off when fault conditions are measured or expected. One well known device of this type is the fully protected DMOS Power Switch manufactured by the International Rectifier Corporation, Type No. IRSF 3010, termed a SMARTFET Transistor. SMARTFET is a trademark of the International Rectifier Corporation, the assignee of this invention.

The device is formed monolithically in a three-pin TO 220 package. Other package styles can be used. The package has an input pin, a drain pin and a source pin. The operating power for the control circuits is provided from the input control signals at the input pin. The device is a fully protected monolithic N-channel, logic level power MOSFET with 80 ohms on-resistance and with built-in circuit protection against overcurrent, over-temperature, ESD and with active over-voltage protection.

The device employs a latching circuit which is integrated into the power FET chip, and which recognizes and memorizes the occurrence of an error and then removes the turn-on signal from the power MOSFET gate. The latch circuit is cleared and reset by holding the input low for a specified minimum duration. Therefore, if a fault condition persists, and the latch circuit is reset in the next cycle of operation, the device turns on into the fault condition and is tripped again, this condition lasting until the circuit is otherwise cleared.

This condition can be avoided by providing a separate reset pin for the package which receives a separate reset input signal. However, this would require a five-pin package and, further, would prevent the use of an SOT223 type package. It is very desirable, however, to make this device as a three-pin package which can be a drop-in replacement for other three-pin packages which are with or without intelligence circuits.

BRIEF DESCRIPTION OF THE INVENTION

In accordance with the present invention, a novel circuit, which may be employed with the circuit of the IRSF 3010, uses analog multiplexing of reset and input on and off signals, and retains a three-pin input circuit and package.

The novel circuit employs two different threshold voltages:
1. A reset threshold which may be typically 1 volt or less. Pulling the input pin below this threshold resets the fault latch.
2. A set threshold which may be typically 3.2 volts. Pulling the input pin above this threshold turns on the MOSgated device, and pulling it below 3.2 volts will turn off the MOSgated device.

The input signal, in non-fault conditions, is switched between a voltage above the reset voltage, for example, 2 volts to turn off the device and a voltage above the set voltage, for example, 5 volts to turn the device on. If the device is turned off due to a fault condition which trips the fault latch, the fault latch cannot be reset by the input off voltage which is higher than the reset voltage. Thus, the latch is not reset until a voltage lower than 1 volt is applied to the input.

Any desired three-state input circuit can be used. However, a specific novel three state drive is disclosed in which three distinct signals are provided from a microcontroller having a resistive divider consisting of resistors which may have two different values, connected in series and across the input and reset terminals of the micro-controller. The node between the resistors is connected to the input terminal pin of the MOSgated device circuit and will have a signal voltage of three states or levels, depending upon the signal levels of the two output ports of the microcontroller. These three signal levels can be 0 volts (to reset), 2 volts (to turn the device off) and 5 volts (to turn the device on). Obviously, other values can be used.

Thus, the present invention provides the effect of a separate reset input signal for a three-pin protected MOSgated device.

Other features and advantages of the present invention will become apparent from the following description of the invention which refers to the accompanying drawings.

DETAILED DESCRIPTION OF EMBODIMENTS OF THE INVENTION

Figure 1:
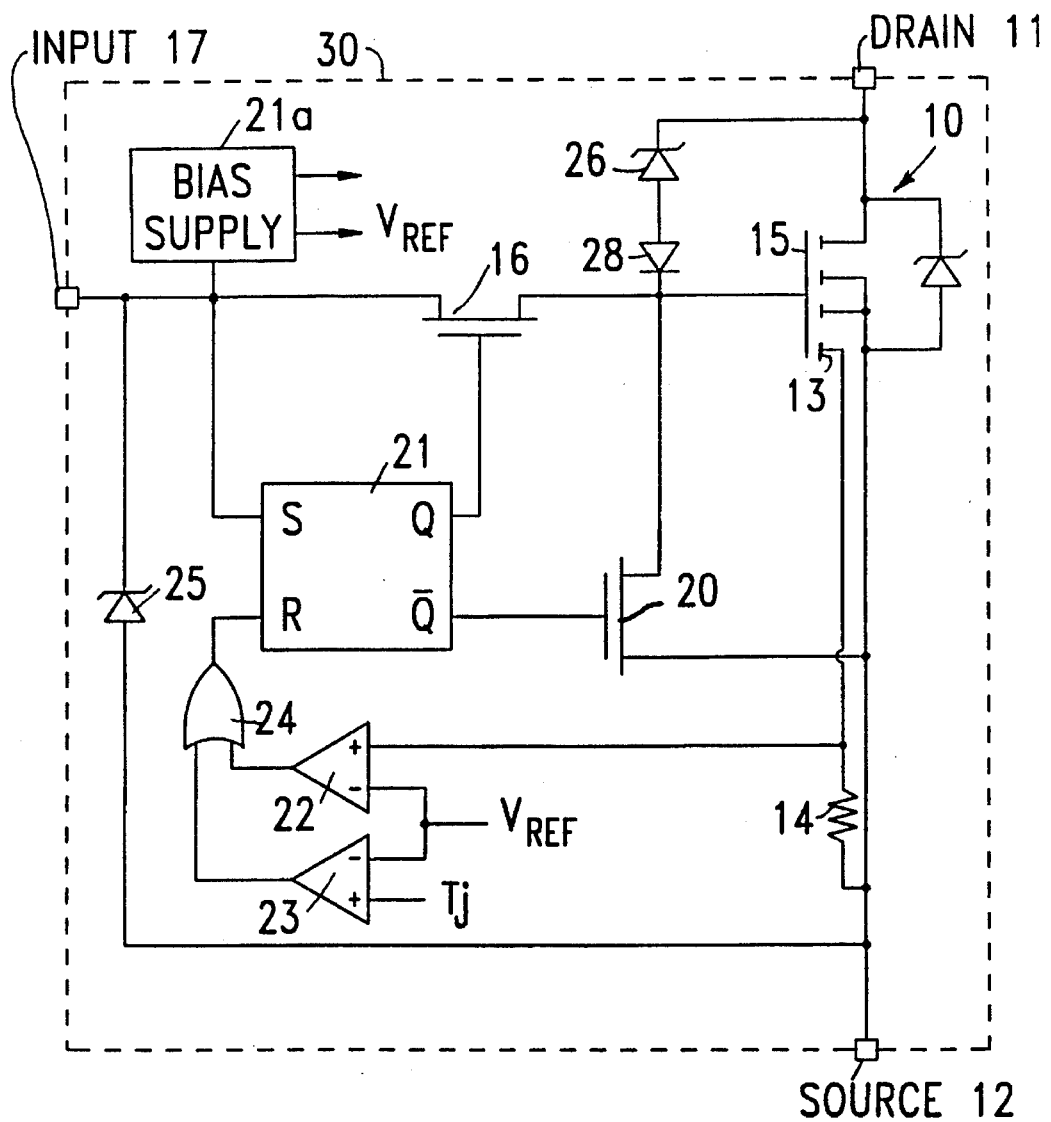
FIG. 1 is a block diagram of a prior art protected MOS power switch.

Referring first to FIG. 1, there is shown a block diagram of a prior art protected MOS controlled switch device in which the protective circuits are integrated into the same chip as the power device. The circuit of FIG. 1 is that of the prior art Smart FET DMOS Power Switch Type IRSF 3010, referred to previously.

In FIG. 1, the power device 10 is a current sensing power MOSFET having a drain electrode connected to a drain pin 11, a source electrode connected to the source pin 12 and a current sensing output electrode 13 connected to resistor 14 as shown. The MOSFET gate electrode 15 is connected through control MOSFET 16 to input pin 17. It should be noted that MOSFET 10 could be any desired MOSgated device, for example, an IGBT or MOSgated thyristor, with any desired current sensing arrangement.

The control circuits for the MOSFET 10 are intended to protect the MOSFET 10 from fault conditions which could otherwise damage or destroy the device or the circuit which it controls. The control circuit could take any form but, in FIG. 1, consists of the aforementioned control MOSFET 16 connected in series with the input circuit of the main MOSFET 10, and a second MOSFET 20 connected between the source and gate of the main MOSFET 10. Also provided are the bias voltage supply circuit 21a which derives its operating power from the input signal at input pin 17, an R-S latch circuit 21, comparators 22 and 23, the OR circuit 24, zener diode 25, and the clamp circuit zener diode 26 and diode 27.

Zener diode 25 provides ESD protection for the circuit and also limits the input voltage, for example, to 10 volts.

Figure 2:
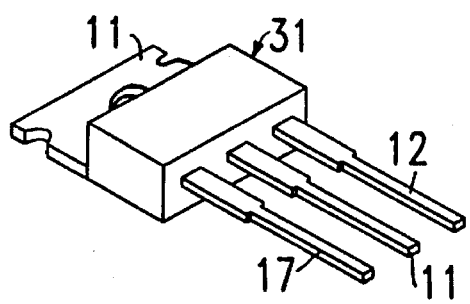
FIG. 2 is a perspective view of a typical three-pin TO 220 package which houses the circuit of FIG. 1.

The circuit of FIG. 1 is shown within block 30. Block 30 corresponds to the integrated circuit silicon chip which is conventionally contained within the three-leaded TO 220 package 31 of FIG. 2. Package 31 contains input lead terminal pin 11, drain terminal pin (and tab) 17 and source pin 12, also referred to in FIG. 1. Note that the protected MOS device of FIGS. 1 and 2 will fit directly into a receptacle designed for a standard unprotected power MOSFET or similar MOSgated device.

The operation of the circuit of FIG. 1 is next described. An input signal source, for example, a micro-controller provides input pulses to input pin 17 to control the switching on and off of the drain current between drain pin 11 and source pin 12 as desired by the user. Note that any suitable load is connected in series with the drain and source pins 11 and 12, such as a d-c motor drive, a solenoid driver, a lamp driver or the like. The device may be switched at frequencies below about 40 kHz with input waveforms switched between 0 and 5 volts to turn MOSFET 10 off and on respectively.

Figure 3A:
FIG. 3a shows the input signal to the input pin of the circuit of FIG. 1 as a function of time.
Figure 3B:
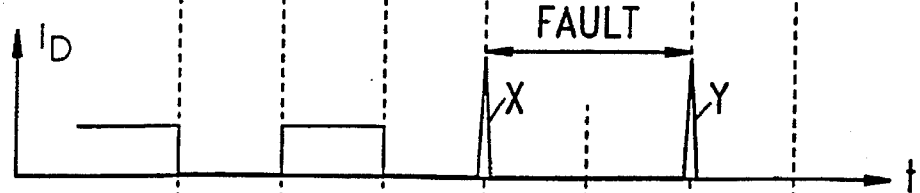
FIG. 3b shows the drain current of the circuit of FIG. 1 on the same time scale as that of FIG. 3a, in the presence of a continuing fault.

FIG. 3a shows a typical input signal waveform to pin 17, and FIG. 3b shows the resulting drain current at pin 11 on the same time scale. During normal operation, when the signal at pin 17 is 5 volts, the MOSFET 10 is on. The current signal at resistor 14 is less than the reference voltage $V_{REF}$ and the over-temperature signal $T_j$ is also less than the reference voltage $V_{REF}$. Therefore, the outputs of comparators 22 and 23 are low and the input at R of the R-S latch is low. As a result, the output at Q is high, turning on MOSFET 16 and the output at $\overline{Q}$ is low, holding MOSFET 20 off.

Still considering normal operation, when the signal at input pin 17 is zero volts, the gate voltage of MOSFET 10 is zero and the device is off. When the input signal is again switched to 5 volts, MOSFET 10 turns on and drain current flows as shown in the first part of FIG. 3b, and the system operates normally.

If an overcurrent or over-temperature condition develops, as shown by the fault spike "x" in FIG. 3b, either or both comparators 22 and 23 have a high output so that the output of OR circuit 24 goes high. This causes the R-S latch to switch the outputs at Q and $\overline{Q}$ to turn off the MOSFET 16, disconnecting the input pin 17 and the gate of MOSFET 10, and to turn on MOSFET 20 to clamp the source pin 12 to the gate of MOSFET 10. Thus, the MOSFET 10 turns off in response to the fault condition.

After a predetermined length of time, the R-S latch is reset by the low input signal at input pin 17. The MOSFET 10 will next turn on when a turn-on signal (a high $V_{in}$) appears at the input 17. If, however, the fault condition still exists, the fault pulse "y" of FIG. 3b will appear, and latch 21 will again operate, this sequence continuing until the fault is cleared or the circuit is timed out.

This condition can be avoided by providing a separate reset pin to provide a separate reset signal to the latch 21 from the microcontrol circuit, and after clearing the fault. However, it is very desirable to retain the three-pin configuration of FIG. 2.

In accordance with the present invention, a novel circuit is provided, using a three-pin configuration, but wherein the input on-signal will not reset the latch after a fault operation.

Figure 4:
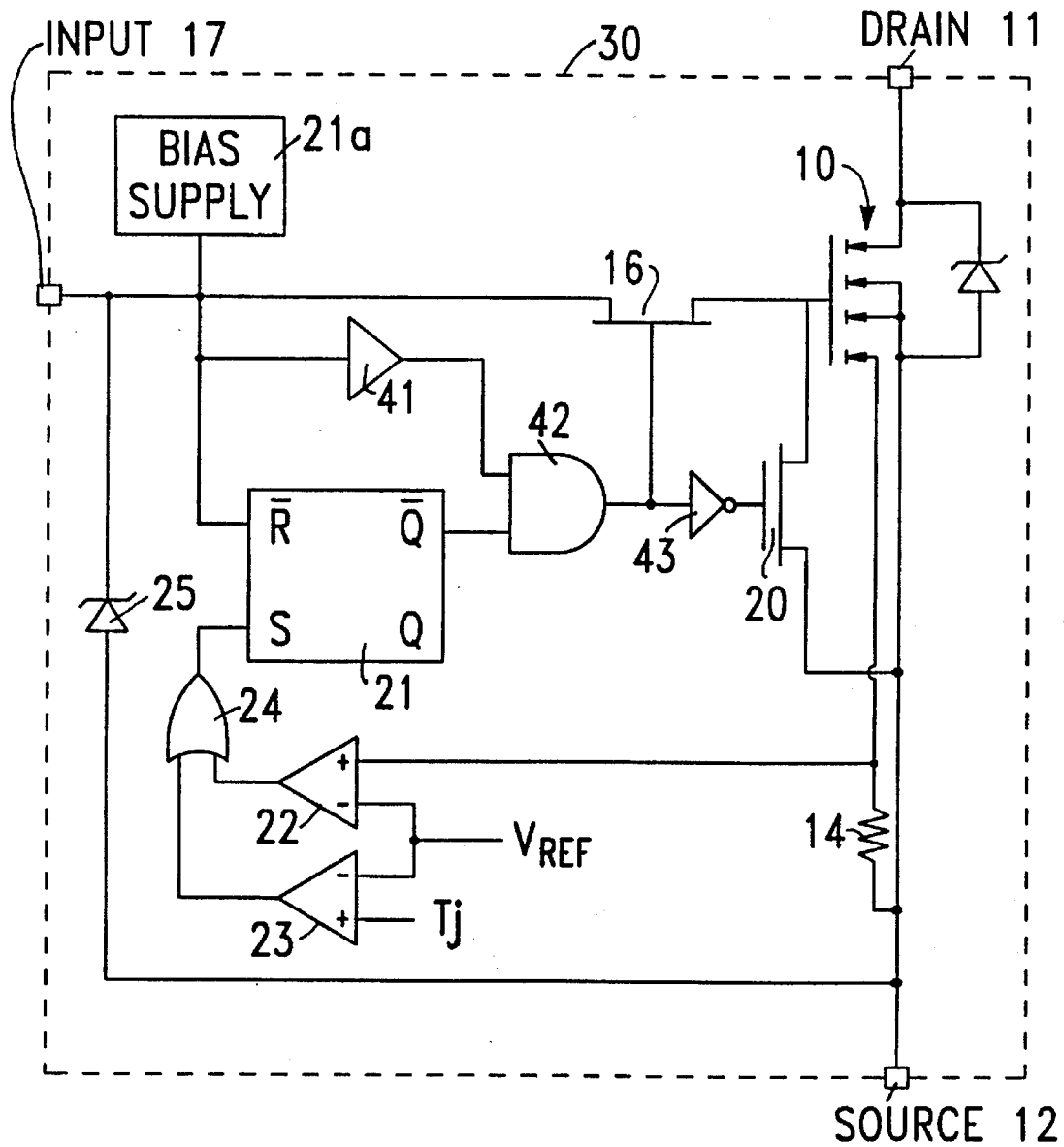
FIG. 4 is a block diagram of the novel protected circuit of the invention.
Figure 5:
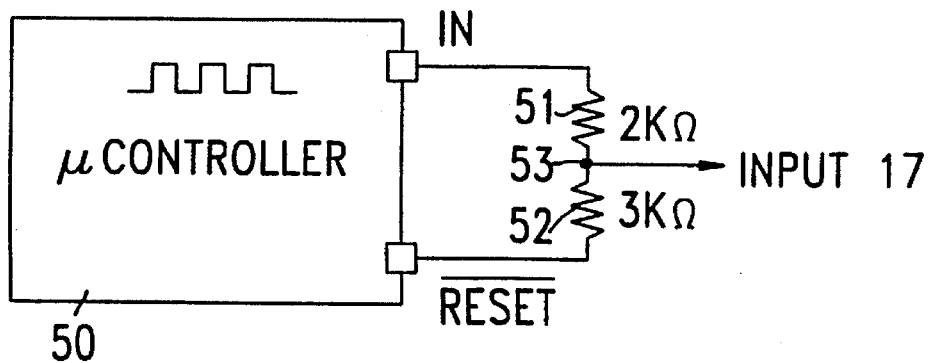
FIG. 5 is a block diagram of the analog output circuit for providing a three-level signal input into the circuit of FIG. 4.

The circuit of the invention is shown schematically in FIG. 4 and its novel signal source is shown in FIG. 5. Components similar to those of FIG. 1 have the same identifying numerals in FIG. 4. The circuit of FIG. 4 is modified, however, in that the R-S latch 21 has a Schmitt trigger 41 associated therewith, having a trigger voltage higher than the reset threshold of latch 21. For example, latch 21 has a reset threshold of 1 volt and trigger 41 a threshold of 3.5 V. The output of trigger 41 and the $\overline{Q}$ output of latch 21 are applied to the inputs of AND circuit 42. The output of AND circuit 42 is applied to the gate of control MOSFET 16 and to inverter 43. The output of inverter 43 is applied to the gate of control MOSFET 20. The reset threshold of latch 21 at input $\overline{R}$ is 1 volt in the embodiment described. That is, the voltage at pin $\overline{R}$ must be 1 volt or less for the latch 21 to reset. Consequently, the circuit of FIG. 4 will react as follows to three different input signal levels at input terminal 17.

If the input is at 5 volts and there is no fault condition, the inputs to AND circuit 42 will be high, MOSFET 16 will be on and MOSFET 20 will be off.

Figure 6A:
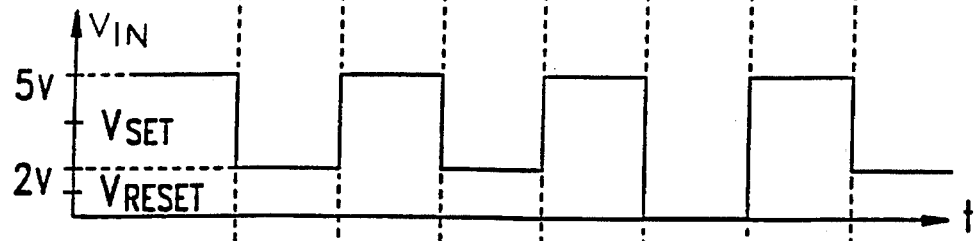
FIG. 6a shows the input signal to the input pin of FIG. 5, produced by the circuit of FIG. 5, as a function of time.
Figure 6B:
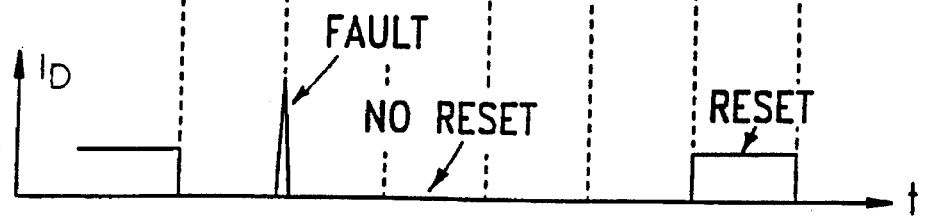
FIG. 6b shows the drain current of the circuit of FIG. 5 on the same time scale as that of FIG. 6a in the presence of a continuing fault.

If the input voltage is reduced to 2 volts, trigger 41 is operated, and the output from trigger 41 is low. Thus, the output of AND gate 42 is low, MOSFET 16 turns off and MOSFET 20 turns on to turn off the main power MOSFET 10. This operation is schematically shown in FIGS. 6a and 6b. So long as the input is switched between 2 and 5 volts, the device will operate like the prior art device of FIG. 1 when the input switches between 0 and 5 volts. Note that latch 21 does not reset during this time.

If now a fault occurs, latch 21 is operated and $\overline{Q}$ goes low so that MOSFET 16 stays off and MOSFET 20 stays on. This condition continues until a third reset signal below the reset threshold voltage of latch 21, preferably 0 volt, is applied to input 17. Pulling the input pin 17 below 1 volt therefore resets the fault latch 21 so that normal operation can continue, as shown in FIG. 7b.

FIG. 5 shows a novel input circuit for producing three different voltage levels to the input terminal under any suitable control, for example, a micro-controller 50. Thus micro-controller 50 has an IN port and RESET port. The voltage at the IN port may be a square wave of controlled duty cycle and switches between 0 and 5 volts as required by the user. The voltage at $\overline{RESET}$ port may be at 5 volts, but can be switched to 0 volt for reset purposes. A resistive divider consisting of resistors 51 and 52, for example 2,000 ohms and 3,000 ohms, respectively, is connected across ports IN and RESET and are connected at node 53. The resistors 51 and 52 may have the same value, or other values than those stated. Node 53 is connected to input 17 in FIG. 5.

The circuit of FIG. 5 provides a three state drive using simply two logic outputs and the resistive divider, and operates as follows:

To produce a 5 volt output, the IN port goes to 5 volts and the RESET port goes to 5 volts. The voltage at node 53 will then also be 5 volts.

To produce a 2 volt output, the IN port goes to 0 volt and the RESET port remains at 5 volts. The resistor divider ratio is such as to produce 2 volts at node 53.

To produce 0 voltage at the node 53 (for reset of the latch 21), it is only necessary to make the voltage at the RESET port 0 volt and the voltage at port IN also 0 volt.

It is to be noted that the invention can be used over any desired range of voltages so long as the reset voltage for the fault latch is lower than the low signal voltage for turning off the MOSFET 10 during non-fault operation.

Figure 7:
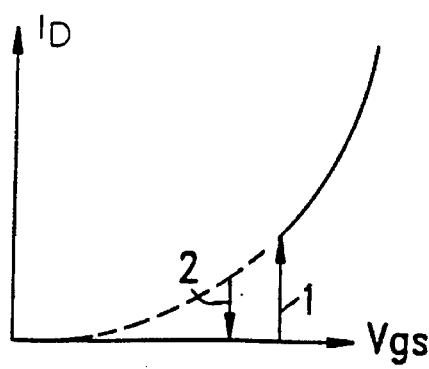
FIG. 7 shows the hysteresis characteristic of the circuit of FIG. 4 to provide improved noise immunity.

As previously stated, the circuit of FIG. 4 has hysteresis due to the Schmitt trigger 41. Thus, as shown in FIG. 7, there is shown the curve of the drain current $I_D$ as a function of the input voltage Vgs at the gate of MOSFET 10. As input voltage Vgs of the MOSFET 10 increases, trigger 41 operates at value 1 which is in excess of 3.5 volts and MOSFET 10 turns on, and current $I_D$ flows. However, during turn off, the gate voltage drops below the value it had at turn-on to a second value of less than about 3.5 volts. This hysteresis effect creates good noise immunity for the circuit.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A control circuit for a power MOSgated circuit; said power MOSgated circuit having first and second main terminal pins and an input terminal pin whereby said input terminal pin controls the switching on and off of said power MOSgated circuit between its said main terminal pins; said power MOSgated circuit including a MOSgated power device having first and second main electrodes connected to said first and second terminal pins and a gate electrode; said control circuit including protective circuit means for monitoring at least one operating condition of said MOSgated power device and for turning off said MOSgated power device when said operating condition exceeds a given value; said control circuit further including at least a first control MOSFET means coupled between said input terminal pin and said gate electrode for controlling the turn on and turn off of said MOSgated power device when a turn-on signal is applied to said input terminal pin; first circuit means coupling said input terminal pin to said control MOSFET means to turn on and off said first control MOSFET means and said MOSgated power device in response to signals of first and second voltage magnitudes respectively; a resettable latch circuit means having an input coupled to said protective circuit means and an output coupled to said first control MOSFET means whereby said latch means is switched to a first latch condition in response to an output of said protective circuit means thereby to disable said first control MOSFET means so that said MOSgated power device turns off; and means coupling said resettable latch means to said input of said latch means for resetting said latch means in response to a signal of a third voltage magnitude which is lower than the lowest of said first and second voltage magnitudes, whereby said power MOSgated circuit is respectively turned on and off and is reset after a fault by three respective signals of first, second and third voltages which are distinguishable from one another applied to said input terminal pin.

2. The circuit of claim 1 wherein said power MOSgated circuit is housed in a three-pin TO 220 style package.

3. The circuit of claim 1 wherein said protective circuit means includes a current measuring circuit and a temperature measuring circuit.

4. The circuit of claim 1 wherein said control circuit includes a second control MOSFET connected between said gate electrode and one of said main electrodes of said MOSgated power device whereby the conduction of said second MOSFET turns off said MOSgated power device; said second control MOSFET being coupled to said input terminal pin and to said latch means such that when said first control MOSFET means is on or off, said second control MOSFET is off or on, respectively.

5. The control circuit of claim 1 wherein said latch circuit means is an R-S latch.

6. The control circuit of claim 1 wherein said first, second and third voltages have different voltage magnitudes of about 5 volts, about 2 volts, and about 0 volt, respectively.

7. The control circuit of claim 1 wherein said first circuit means includes a Schmitt trigger.

8. The control circuit of claim 4 wherein said first circuit means includes a Schmitt trigger.

9. The control circuit of claim 8 wherein said first circuit means further includes an inverter circuit having an input connected to the output of said Schmitt trigger and to the gate of said first control MOSFET means and an output connected to the gate of said second control MOSFET.

10. The control circuit of claim 9 which further includes an AND circuit having a first input connected to the output of said Schmitt trigger, a second input connected to an output of said latch circuit means, and an output connected to said input of said inverter circuit.

11. The circuit of claim 1 which further includes an input circuit connected to said input terminal pin; said input circuit having means for selectively producing said first, second and third signal voltages; said input circuit including first and second output ports each selectively switchable between first and second respective voltage outputs and a resistive divider circuit connected across said first and second output ports and having a node connected to said input terminal pin.

12. The circuit of claim 11, wherein the resistance values of said divider circuit are different on opposite sides of said node.

\* \* \* \* \*

UNITED STATES PATENT AND TRADEMARK OFFICE
CERTIFICATE OF CORRECTION

PATENT NO. : 5,563,759
DATED : Oct. 8, 1996
INVENTOR(S) : Bruno C. Nadd

It is certified that error appears in the above-indentified patent and that said Letters Patent is hereby corrected as shown below:

Column 3, line 33, change "11" to --17-- and "17" to --11--.

Signed and Sealed this

Eighteenth Day of February, 1997

Attest:

BRUCE LEHMAN

*Attesting Officer*   *Commissioner of Patents and Trademarks*